US007653094B2

(12) United States Patent
Sesko

(10) Patent No.: US 7,653,094 B2
(45) Date of Patent: Jan. 26, 2010

(54) EXTERNAL CAVITY LASER WITH FLEXURE TUNING ELEMENT

(75) Inventor: David W. Sesko, Woodinville, WA (US)

(73) Assignee: Mitutoyo Corporation, Kawasaki (JP)

( * ) Notice: Subject to any disclaimer, the term of this patent is extended or adjusted under 35 U.S.C. 154(b) by 16 days.

(21) Appl. No.: 11/088,961

(22) Filed: Mar. 24, 2005

(65) Prior Publication Data

US 2006/0215724 A1 Sep. 28, 2006

(51) Int. Cl.
*H01S 3/10* (2006.01)
(52) U.S. Cl. ...................................... 372/20
(58) Field of Classification Search .................. None
See application file for complete search history.

(56) References Cited

U.S. PATENT DOCUMENTS

| 2,716,537 | A | * | 8/1955 | Galonska | 254/122 |
| 4,043,403 | A | * | 8/1977 | Anderson et al. | 172/413 |
| 5,319,668 | A | | 6/1994 | Luecke | |
| 5,347,527 | A | | 9/1994 | Favre et al. | |
| 5,384,662 | A | * | 1/1995 | Andresen et al. | 359/894 |
| 5,594,744 | A | | 1/1997 | Lefevre et al. | |
| 5,771,252 | A | * | 6/1998 | Lang et al. | 372/20 |
| 5,867,512 | A | | 2/1999 | Sacher | |
| 5,995,521 | A | * | 11/1999 | Moore et al. | 372/20 |
| 6,690,690 | B2 | | 2/2004 | Marron | |
| 2003/0007523 | A1 | * | 1/2003 | Chapman et al. | 372/20 |
| 2003/0026302 | A1 | | 2/2003 | Anthon et al. | |
| 2004/0016540 | A1 | | 1/2004 | Jarchau et al. | |
| 2004/0075919 | A1 | * | 4/2004 | Diaz et al. | 359/837 |
| 2004/0109487 | A1 | | 6/2004 | Zhang | |
| 2004/0165640 | A1 | * | 8/2004 | Clifford et al. | 372/97 |
| 2004/0182179 | A1 | * | 9/2004 | Metzger et al. | 73/862.632 |

FOREIGN PATENT DOCUMENTS

| DE | 195 09 922 A1 | 9/1996 |
| DE | 199 35 612 A1 | 5/2000 |
| WO | WO 98/52256 | 11/1998 |

OTHER PUBLICATIONS

Day et al. "Widely Tunable External Cavity Diode Laser", Feb. 9, 1995, SPIE, vol. 2378, p. 35-41.*

* cited by examiner

*Primary Examiner*—Minsun Harvey
*Assistant Examiner*—Sean Hagan
(74) *Attorney, Agent, or Firm*—Oliff & Berridge, PLC

(57) ABSTRACT

An external cavity diode laser may have an output wavelength that is tuned by an end mirror mounted on an element having a flexure hinge. The flexure hinge may be designed to exhibit a stationary pivot point over a desired tuning range, and may allow the external cavity to be tuned without the laser hopping between longitudinal modes. Chromatic dispersion of the laser medium may be accommodated by adjusting a distance between a laser diode and a grating included within the external cavity. The position may be adjusted to find an operating configuration which allows mode-hop-free tuning over the entire desired tuning range.

13 Claims, 13 Drawing Sheets

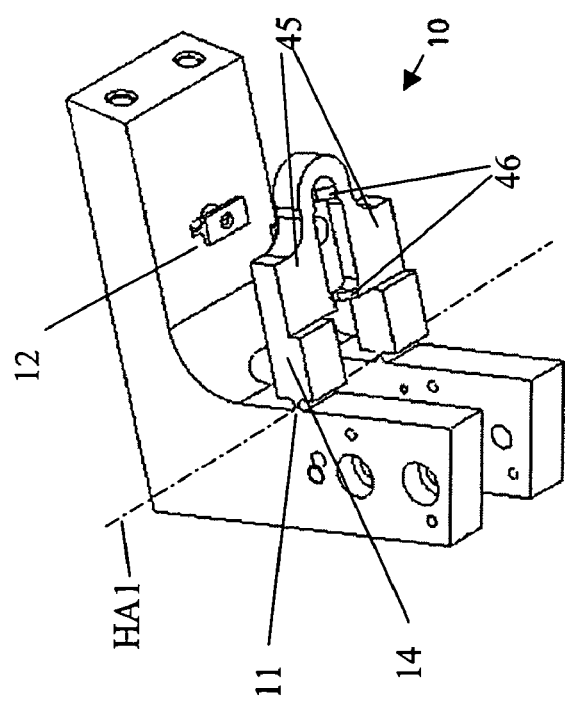
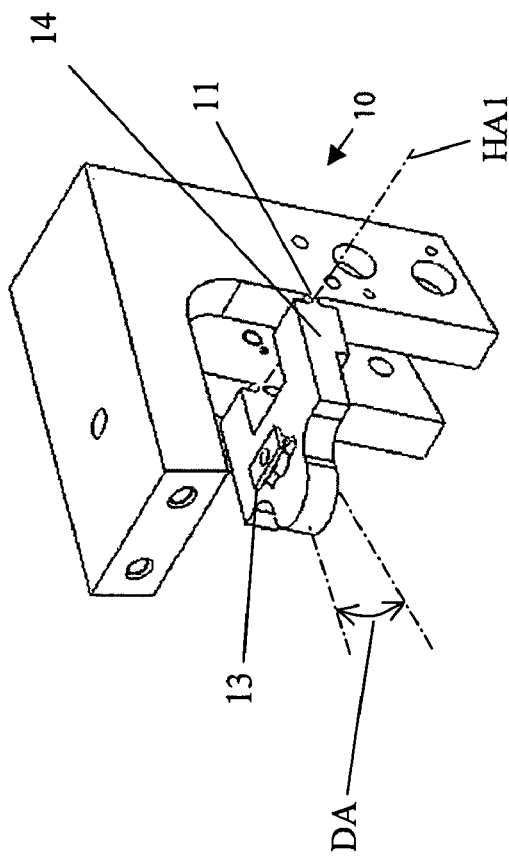
Fig. 2A
Fig. 2B

EXTERNAL CAVITY LASER WITH FLEXURE TUNING ELEMENT

BACKGROUND

This invention is directed to external cavity semiconductor lasers.

Tunable external cavity diode lasers (ECDLs) are widely used in light-based test and measurement equipment and are increasingly used in wavelength division multiplexed (WDM) optical voice and data communications devices. Tunable external cavity diode lasers operate by having a laser gain medium inserted into an external cavity, which provides wavelength-selective optical feedback to the laser gain medium.

Multiple longitudinal spectral modes may be supported by the cavity, corresponding to wavelengths such that the optical cavity length is an integral number of half-wavelengths. The gain medium provides nearly equivalent gain at the wavelength of the adjacent modes so mode hopping may occur, when, while changing the tuning of the external cavity, an adjacent external cavity longitudinal mode experiences a similar external cavity loss. The cavity may support the multiple modes, or may "hop" between the modes due to mode competition.

Tuning of the external cavity may generally be achieved by inserting a wavelength selector in the cavity, such as a diffraction grating. The diffraction grating may be used as the end reflector in the external cavity, in the "Littrow" arrangement, or may be disposed before the end reflector in the "Littman" arrangement. In the Littman arrangement, the laser beam is incident on the grating at a grazing incidence, and the first order diffracted beam is reflected from an end tuning mirror. The end tuning mirror then retroreflects the beam of the selected wavelength back onto the grating and into the laser diode. The wavelength may be tuned by changing the angle of the end tuning mirror.

In practice, the Littman arrangement may be preferred, because of the large area of the grating covered by the laser beam at grazing incidence, and because the double pass of the beam on the wavelength-selecting grating results in higher spectral selectivity.

In either the Littman or Littrow arrangements, in order to obtain a continuous tuning of the output of the laser diode that is free of mode hops, the cavity length must be changed in a synchronized manner with the wavelength tuning of the external cavity, so that the same integral number of half wavelengths is maintained within the cavity during tuning. However, the total cavity length, that is, the effective optical path length, must also take into account variations in the cavity length due to chromatic dispersion of the various materials within the cavity. Chromatically dispersive elements are elements having an index of refraction which depends on the wavelength of the light being transmitted through the material. Therefore, the effective optical path length of the external cavity depends on the wavelength of the light circulating in the external cavity.

Recently, various compact systems have been described that provide continuous mode-hop-free tuning for external cavity semiconductor lasers. Examples of these systems include U.S. Pat. No. 5,867,512 to Sacher (the '512 patent), and U.S. Pat. No. 5,319,668 to Luecke (the '668 patent), each of which is incorporated herein by reference in its entirety.

The '512 patent discloses a tuning arrangement for a semiconductor laser diode in an external resonator in a Littman arrangement, with a diffraction grating and a resonator end mirror mounted on a pivotable tuning arm. An adjustment means is provided which adjusts the position of the tuning arm and the location of the end mirror relative to the pivot axis of the tuning arm. Another adjustment means may be provided to adjust the location of the diffraction grating relative to the pivot axis of the tuning arm.

The '668 patent discloses a tunable laser system in which the pivot point of the pivotable end mirror may be selected so as to provide an internal cavity length which is exactly an integral number of half wavelengths at three different wavelengths and a close match at all other wavelengths within the tuning range. The pivot point calculation takes into account the effect of dispersion of the laser and other optical elements in the system on the cavity length. The pivot bearing in the '668 patent is a ball that rests in a socket.

SUMMARY

The systems described in the prior art rely on precise placement of the laser, diffraction grating or end mirror, and/or provide adjustment means for adjusting the locations of these elements and/or the associated pivot point, to correct for chromatic dispersion effects and provide continuous tuning that is free of mode hops. However, the prior art continuous tuning systems and adjustment means compromise the robustness of the system because they may typically employ a number of separate, relatively movable, parts for adjustment and/or pivot structures, which may tend to add mass and size to the system. In addition, the use of relatively movable parts for adjustment and/or pivot structures may lead to associated stiction or mechanical hysteresis, which may degrade the wavelength stability of the laser, as well as introduce potential adjustment instability issues. Size, weight, stiction, and the like, may all be particularly significant problems when extremely rapid tuning, or high-frequency oscillatory tuning, are desired for a tunable laser. In such applications, extremely rapid and smooth tuning behavior may be desired. However, even slight weight increases may reduce the natural frequency of a system, requiring relatively larger drive systems and more power in order to drive the system at the desired (e.g., the highest practical) frequencies.

Furthermore, the operating characteristics of laser diodes may be heat sensitive and more drive power may typically be associated with more severe heating effects, so the laser system wavelength stability or predictability may suffer with increased drive power. Furthermore, relatively movable parts and the associated stiction in the assembly may be susceptible to potential shifts and/or wear induced by dynamic forces. Therefore, relatively movable parts may be particularly detrimental to the short and long-term stability and smooth tuning characteristics of a high-frequency oscillatory tuning system. Furthermore, such devices may also be susceptible to external shock and vibration forces, which may tend to alter the alignment of parts. It should be appreciated that in laser tuning applications, assembly precision of tens of microns or better may be required, and even higher levels of post-assembly stability may be desirable.

Furthermore, relatively more complex setup and alignment procedures may be relatively more time consuming, expensive and prone to error. Therefore, it may be desirable that setup and alignment procedures be as simple as possible relative to the accuracy and operating characteristics desired for a particular tunable laser application. Thus, it should be appreciated that the design tradeoffs associated with even slight alterations to the configuration of a tunable laser may be complicated, and certain design choices may be critical to practically and economically achieving the tunable laser characteristics desired for particular applications.

Systems and methods for tuning an external cavity semiconductor laser that can overcome one or more of these disadvantages or limitations with respect to desired tuning ranges and/or tuning rates or operating frequency characteristics, while providing continuous mode-hop-free tuning, would be desirable.

Systems and methods disclosed herein for tuning an external cavity laser device over a desired range may provide a continuously tunable single mode output that is mode-hop-free. The external cavity may comprise a gain medium outputting a beam of light, a diffraction element which diffracts the beam of light, and an end mirror which reflects the diffracted light beam. The continuous tuning may be provided by mounting the end mirror on an element hinged with a flexure hinge that effectively pivots about a stationary pivot point. The stationary pivot point may be nominally located at an intersection of an effective reflecting plane of the end mirror and a plane of the grating surface to allow mode-hop-free tuning. Since the flexure hinge may be part of a monolithic structure, the tunable laser structure need not be susceptible to stiction, backlash, or other dynamic sources of error, wear, or drive power loss.

By adjusting the position of the laser diode, the cavity length between the laser diode and the grating surface may be set to sufficiently compensate for the effects of chromatic dispersion over a desired tuning range. In one method of adjustment, the output power of the laser may be monitored as a means to detect mode-hops, while the laser is tuned over the desired tuning range and the position of the laser diode is adjusted. Adjusting the position of the laser diode may be continued until the monitored output power indicates that a configuration with zero mode hops, or at least a reduced number of mode hops, is achieved for the desired tuning range.

The mechanical configurations for an external cavity tunable diode laser disclosed and taught herein may be particularly suitable for tuning ranges on the order of approximately +/−0.5 nm, +/−1.0 nm, or approximately +/−5 nm, and may offer unprecedented advantages over such tuning ranges.

These and other features and advantages of the systems and methods are described in, or are apparent from, the following detailed description of various exemplary embodiments.

BRIEF DESCRIPTION OF THE DRAWINGS

Various exemplary embodiments are described in detail, with reference to the following figures, wherein:

FIGS. 2A and 2B are isometric views of an exemplary flexure body usable in accordance with this invention;

DETAILED DESCRIPTION OF EXEMPLARY EMBODIMENTS

It should be understood that the various tunable laser elements illustrated herein may be represented schematically and may not be necessarily to scale, either in their various dimensions or in their angular relationships. It may be possible, based on the following detailed description of various exemplary embodiments, to select dimensions and angular relationships for such devices that are suitable for a particular embodiment or application.

Figure 1:
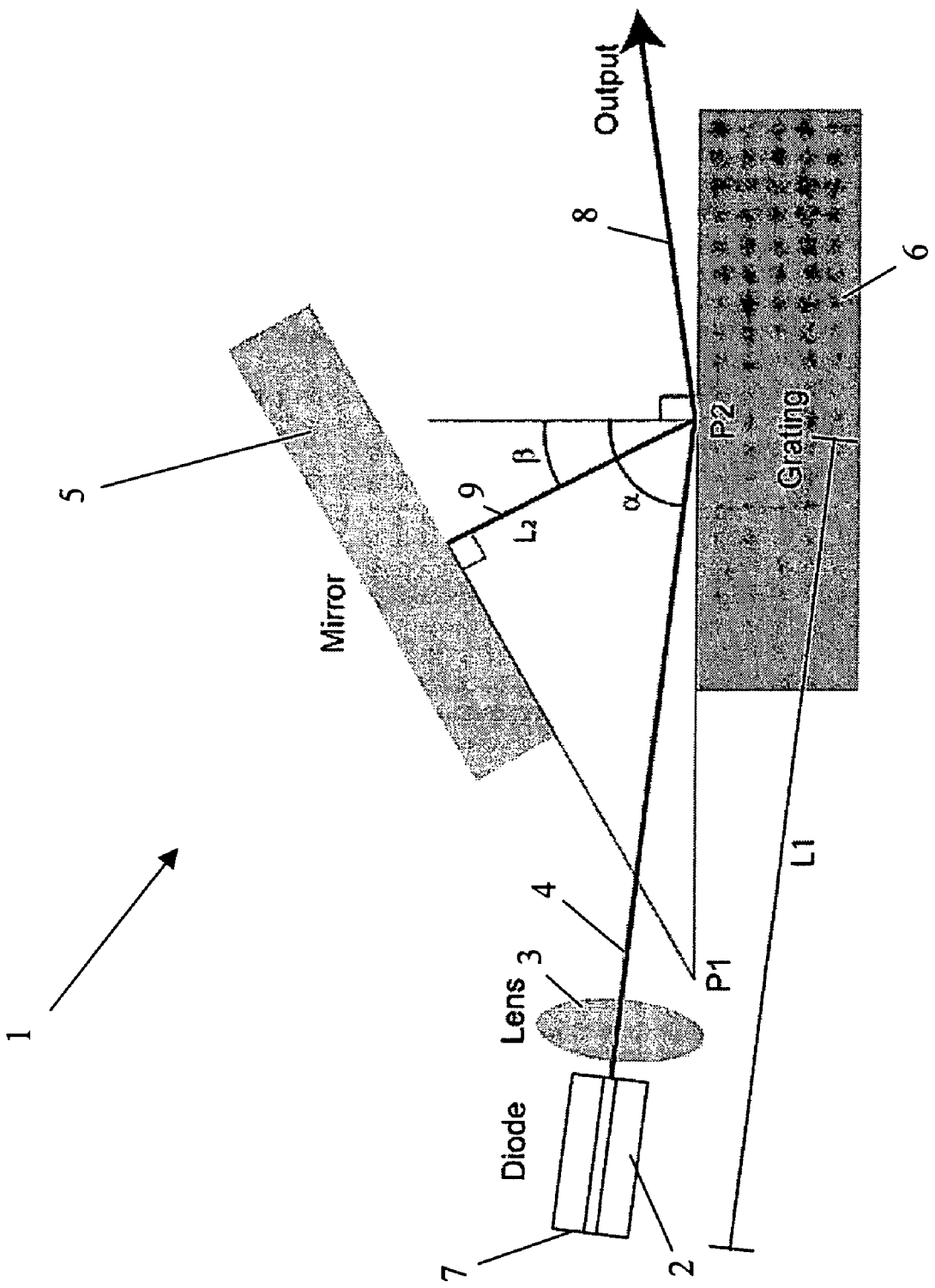
FIG. 1 illustrates geometric parameters of an external cavity laser diode.

FIG. 1 is a diagram of an exemplary geometry for a tunable external cavity diode laser 1. The laser 1 may have a laser gain medium 2, which outputs a laser light beam 4 that extends from the back facet 7 of the gain medium 2 through a collimating lens 3, which collimates the laser light of the beam 4. Beam 4 may be incident on a diffraction grating 6, which may diffract the beam 4 into a first order diffracted beam 9, and reflect a zero order beam 8, which may be the output beam of external cavity diode laser 1. The first order diffracted beam 9 may be retroreflected by a mirror 5, which may form one of the end mirrors of the external cavity of the laser 1. The other end mirror may be a rear surface 7 of laser gain medium 2.

A total optical path L within the cavity may be made up of a fixed distance $L_1$ between rear surface 7 of gain medium 2 and grating 6, and a variable distance $L_2$ between grating 6 and an effective reflecting plane of the mirror 5.

The external cavity diode laser 1 may be tuned, for example, by changing an angle of mirror 5 with respect to grating 6. To the extent that an angle β of the first order diffracted beam 9 with respect to an axis normal to the grating 6 may be a function of the wavelength of the beam 4, the angle of the mirror 5 may determine which wavelength retroreflects to the diffraction grating 6 such that it is diffracted to be fed back into the laser gain medium 2. Therefore, mirror 5 may comprise a tuning element within the external cavity diode laser 1.

The continuous mode-hop-free tuning requirement for an external cavity of optical path length L is:

$$\frac{d\lambda}{\lambda} = \frac{dL}{L} \quad (1)$$

where $$\frac{\lambda}{L}$$

is a constant. In Eq. (1), λ is the tuned wavelength and L is the total optical path length included in the fixed distance $L_1$ and the variable distance $L_2$. The mirror 5 may be disposed on an actuator (not shown) which has a stationary pivot point P1. If the pivot point P1 is located at the intersection of the effective reflecting plane of the mirror and the plane of the grating surface, and if the condition $(L_1/\sin \alpha)=(L_2/\sin \beta)$ is fulfilled, then, ignoring the effects of chromatic dispersion, the laser 1 may be continuously tuned, with no mode hops, in accordance with Eq. (1). Accordingly, a first design feature that may be useful for obtaining a mode-hop-free tunable laser (but not necessarily sufficient, when considering the effects of chromatic dispersion) may be the design of an actuator for the mirror 5 which has a stationary pivot point nominally located at the intersection of the effective reflecting plane of the mirror 5 and the plane of the grating surface, e.g., the point labeled P1 in FIG. 1. Ideally, the actuator may maintain a constant pivot point location under all expected operating conditions, pivot with no stiction, hysteresis, or other instability, and be relatively rigid.

FIGS. 2A and 2B are isometric views of an exemplary flexure body 10 usable in various exemplary embodiments to support the mirror 5, of external cavity diode laser 1. The flexure body 10 may include actuator driver mounting flexures 12 and 13, and a flexure arm 14 that is monolithically attached to the flexure body 10 by a flexure hinge structure 11, in order to provide an approximately ideal mirror actuator that is free of stiction, hysteresis, and other instabilities. The flexure arm 14 may include a first alternative mirror mounting surface 45, which may be suitable for mounting a plane mirror. The effective reflecting plane of a plane mirror is the plane of its reflecting surface. As a second alternative, the flexure arm 14 may include a set of "V" shaped mirror mounting surfaces 46 formed in the flexure arm 14 such that the points of the V-shaped surfaces are aligned along an axis orthogonal to the hinge axis HA1. The alternative mirror mounting surfaces 46 are advantageous for mounting and aligning an orthogonal dihedral prism mirror that may be used as a tuning mirror, as described in greater detail below with reference to various assembly and alignment procedures. Since it is a type of retroreflector, the effective reflecting plane of an orthogonal dihedral prism mirror is partially defined by the direction of the incoming light. In particular, in the present application, the effective reflecting plane of an orthogonal dihedral prism mirror may desirably be a plane that includes the line of intersection of the nominal planes of the orthogonal reflecting surfaces of the orthogonal dihedral prism mirror, and that is also orthogonal to the plane of dispersion of the diffracted wavelengths of light arising from the diffraction grating 6, or the diffraction grating 40 described further below, or the like.

For a desired range of a flexure arm deflection angle DA, with a properly designed flexure hinge structure 11 a hinge axis HA1 may remain effectively stationary and may provide a stationary pivot point P1, as described above with reference to FIG. 1. Design considerations for designing such flexure hinge structures for a desired range of flexure arm deflection angles are described in greater detail below, with reference to FIGS. 4-8.

When chromatically dispersive materials are disposed in the path of the light traveling within a laser cavity, as may be the case for practical external cavity diode laser designs, the total optical path length L may change as a function of wavelength. Thus, to provide mode-hop-free tuning, a second design feature may be required in addition to a properly located stationary pivot point, in order to accommodate the chromatic dispersion effects over the desired tuning range. With reference to FIG. 1, chromatic dispersion effects may be accommodated over a desired tuning range by adjusting the position of the laser diode 2, or an assembly comprising the laser diode 2 and lens 3, to properly select the distance L1 to point P2 on the grating 6. Methods for selecting the distance L1 to accommodate chromatic dispersion effects over the desired tuning range are described in greater detail below, with reference to FIGS. 11-13.

Due to practical fabrication tolerances and limitations, in practice the actual position of the hinge axis HA1 or the stationary pivot point P1 may be slightly displaced relative to the intersection of the effective reflecting plane of the tuning mirror and the plane of the grating surface. That is, the nominal placement target of the hinge axis HA1 or the stationary pivot point P1 may at the intersection of the planes, but the nominal placement may not perfectly achieve the ideal placement. However, it should be appreciated that provided that the nominal placement of the hinge axis HA1 or the stationary pivot point P1 is sufficiently close to the ideal placement, which may be achieved with practical fabrication and assembly tolerances, then the procedures outlined herein for adjusting the distance L1 to accommodate chromatic dispersion will also accommodate effects associated with the imperfect location of the hinge axis HA1 or the stationary pivot point P1, such that mode-hop-free tuning may be provided over a desired range.

Figure 3:
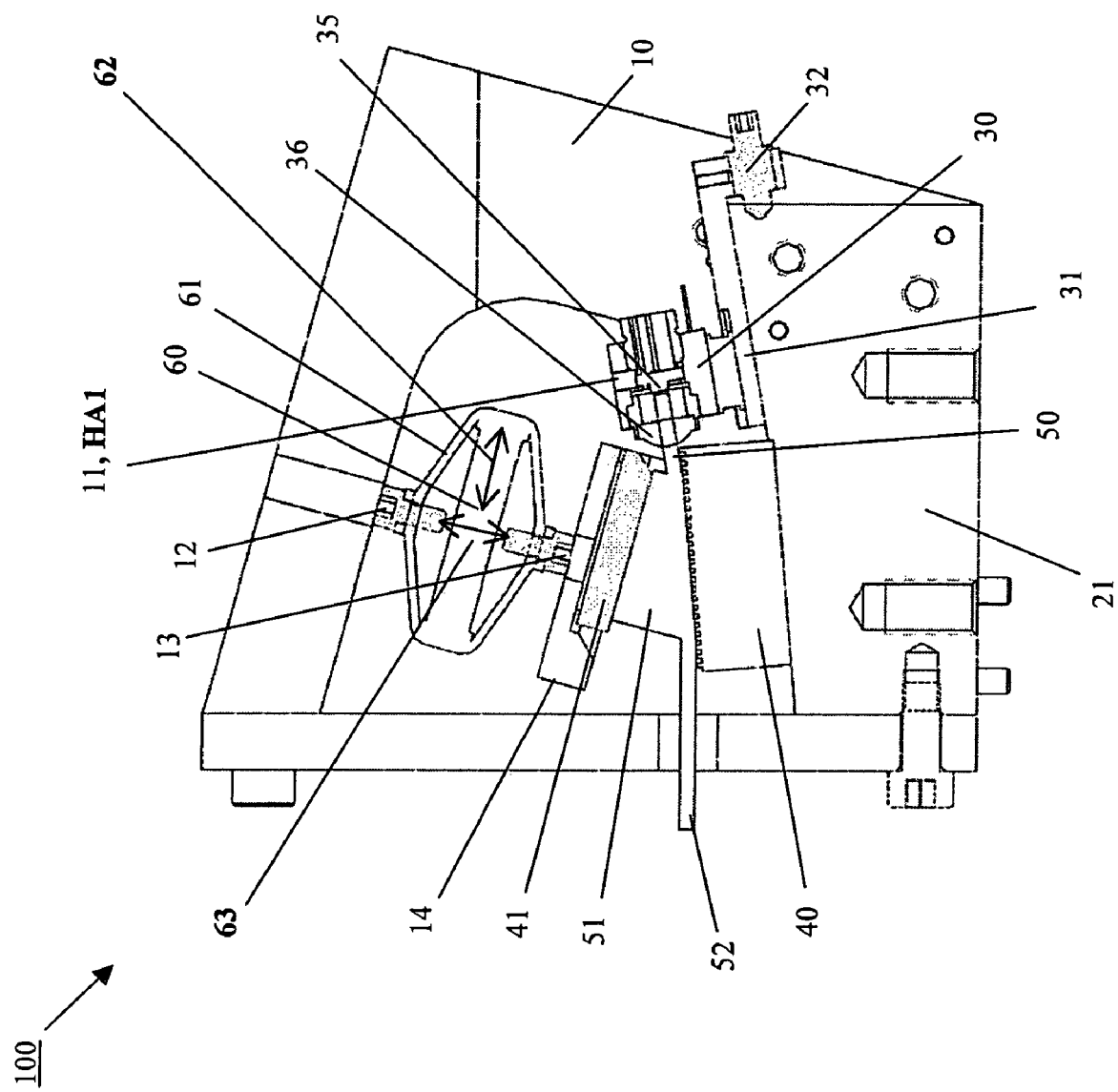
FIG. 3 is a cross-sectional side view through the laser beam plane of an exemplary tunable external cavity diode laser assembly employing the flexure body of FIGS. 2A and 2B.

FIG. 3 shows an exemplary external cavity diode laser 100 employing the exemplary flexure body 10 as a tuning element and a laser radiation source comprising an adjustable laser diode module 30 positioned to accommodate chromatic dispersion effects. The laser diode module 30 is shown installed in a flexure body 10. The flexure body 10 may include the flexure arm 14 which may be attached to the flexure body 10 by the flexure hinge structure 11, obscured in FIG. 3 by the laser diode module 30, but shown in greater detail in FIGS. 2 and 4. The two actuator driver mounting flexures 12 and 13 may attach a piezoelectric transducer 60 to the frame of the flexure body 10 and the flexure arm 14. The piezoelectric transducer 60 may include a linkage frame 61 that is used to attach the piezoelectric transducer 60 to the flexures 12 and 13. The piezoelectric transducer 60 including the linkage frame 61 may be obtained as an assembly from Cedrat Technologies, France, as model no. APA40SM. Flexures 12 and 13 may be designed to be more compliant than flexure hinge structure 11.

Alternative types of actuator drivers may also be used, such as actuators based on magnetostriction, voice coil actuation, direct current (DC) and stepping motor actuation However, the piezoelectric transducer 60 including the linkage frame 61 may have the advantage that the linkage frame 61 is sufficiently compliant to effectively provide additional degrees of freedom, in addition to the flexures 12 and 13, to help insure that the moving and/or flexing elements of the external cavity diode laser 100 are not mechanically over-constrained. This, in turn, may help to insure that the flexure hinge structure 11 is not significantly stressed or distorted during actuation and deflection of the flexure arm 14 and mirror 41, which may contribute to the ability of the design to maintain an effectively stationary hinge axis and/or pivot point, and may also help to insure that the yield strength of the flexure material is not exceeded under the expected operating ranges and conditions. Furthermore, the linkage frame 61 may be formed such that expansion and contraction of the central piezoelectric element along the direction 62 is magnified along the direction 63 that coincides with the deflection angle of the flexure arm 14, a feature that may allow more compact dimensions for certain tunable laser configurations. Also, the central piezoelectric element may be preloaded by the linkage frame 61, which enhances the stability of the piezoelectric crystal.

The flexure body 10 may be formed of any elastic material, for example, tempered spring steel such as PH17-4, and may be fabricated by using a suitable process, such as electrode discharge machining (EDM), for example, to fabricate the material in the regions of the various flexures. Various hardening processes may also be applied in the regions of the various flexures to increase their yield strength, if desired. The flexure body 10 may be attached to an optical bench 21 that may have both a diffraction grating 40 and the laser diode module 30 mounted on its surface.

The optical bench 21 may be precision machined so that the surface carrying the diffraction grating 40 is at a well-defined angle relative to the surface carrying the laser diode module 30, which may be mounted to a laser cell base 31. The precision may be sufficient such that a collimated output beam 50 from the laser diode module 30 has a desired angle of incidence relative to a surface plane of the diffraction grating 40 simply by locating the corresponding parts against the corresponding mating surfaces of the optical bench 21. Furthermore, in such a configuration, the laser cell base 31 and the attached laser diode module 30 may be translated along the mating surface of the optical bench 21 approximately along the direction of the collimated output beam 50, in order to adjust a distance between the laser diode module 30 and the diffraction grating 40 as outlined further below, and the desired angle of incidence of the collimated output beam 50 relative to the surface plane of the diffraction grating 40 need not be disturbed by such an adjustment.

The laser diode module 30 may comprise a laser gain medium 35 and a collimating lens 36. Light may exit laser gain medium 35 through an anti-reflective coating on the front facet of the laser gain medium 35. Methods for antireflection coating laser diode facets are known, and antireflection coated diodes of acceptable quality are available from several vendors, including Sacher Lasertechnik of Marburg, Germany. The collimating lens 36 may collimate the P-polarized beam exiting the front facet of the laser gain medium 35. This collimated output beam 50 may be incident on the diffraction grating 40 at an angle α to its normal, as shown by the angle α in FIG. 1.

Diffraction grating 40 and laser diode 35 may be disposed such that the angle α is at a grazing incidence. Diffraction grating 40 may diffract the laser beam into a diffracted first order beam 51, which comes off diffraction grating 40 at the angle β with respect to the normal axis to grating 40, as illustrated in FIG. 1. The zero-order reflection of the laser beam off the diffraction grating 40 constitutes an output beam 52 from the external cavity laser 100.

The first order diffracted beam 51 may be incident on a tuning mirror 41, which may be mounted on a mounting surface of the flexure arm 14, and a selected wavelength may be retroreflected by the tuning mirror 41 back onto diffraction grating 40 and diffracted back into laser gain medium 35 of the laser diode module 30. In this way, depending on the angular deflection of the flexure arm 14, the tuning mirror 41 may select the wavelength which is fed back into laser gain medium 35, as the wavelength being that which is diffracted at normal incidence to the effective reflection plane of the tuning mirror 41 from the diffraction grating 40. Therefore, angular deflection of the tuning mirror 41 may determine the output wavelength of the external cavity laser 100.

The angular deflection of the tuning mirror 41 about the hinge axis HA1 (best seen in FIG. 2) may be adjusted by controlling the piezoelectric transducer 60. For example, applying a relatively large plus or minus voltage to the transducer 60 may cause it to expand or contract by a relatively large amount along the direction 63. The expansion or contraction may cause a downward (pushing) force or upward (pulling) force, respectively, to be exerted on flexure arm 14, which may cause flexure arm 14 to rotate about the approximately stationary hinge axis HA1 of the flexure hinge structure 11. The motion of flexure arm 14 may cause tuning mirror 41, mounted to the flexure arm 14, to change its angle relative to diffraction grating 40, as well as its distance from the diffraction grating 40, in the synchronized manner appropriate for mode-hop-free tuning.

Figure 4:
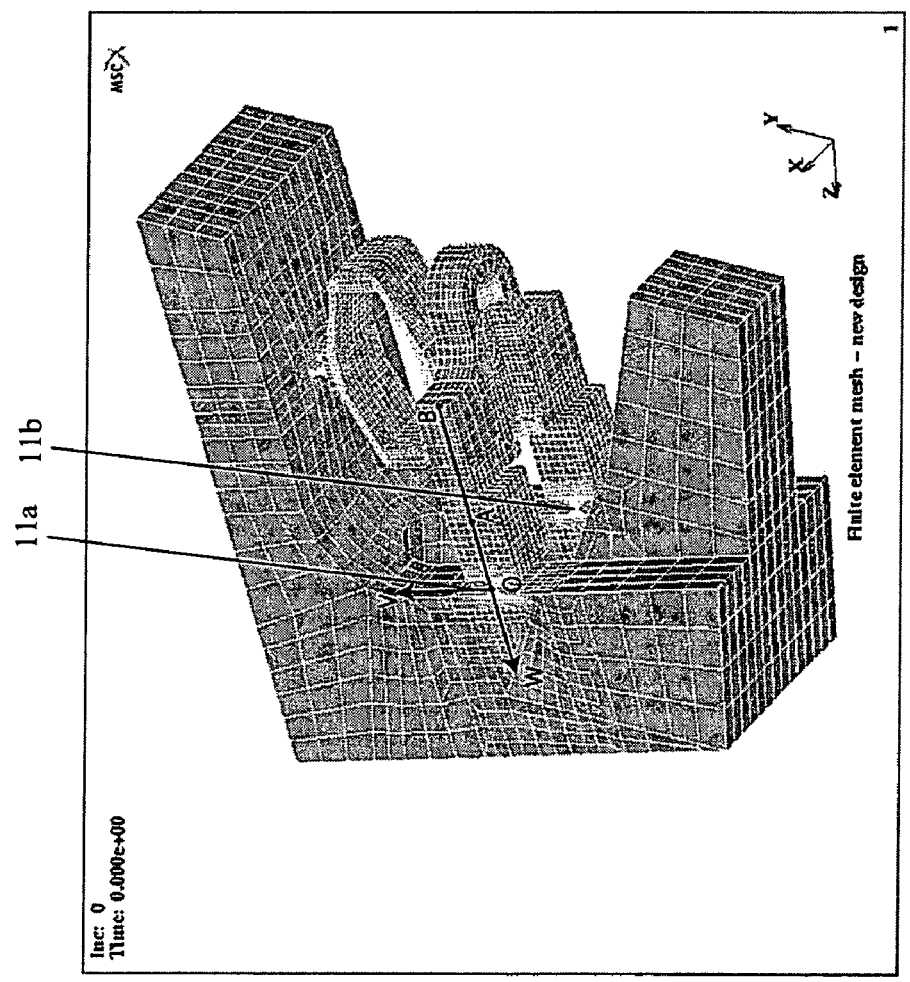
FIG. 4 shows a mesh used for finite element analysis of a flexure tuning arm of the tunable external cavity diode laser assembly of FIG. 3.

The flexure hinge structure 11 may be advantageous because it has no parts which move relative to, and contact, other parts. An exemplary design of the flexure hinge structure 11 is shown in FIG. 4. The flexure hinge structure 11 may include two separate flexure hinge structures 11a and 11b, as shown, which may be arranged across a gap such that their hinge or pivot axes are collinear. The gap between flexure hinge structures 11a and 11b may accommodate the placement of the laser diode module 30. Because the flexure hinge structure 11 has no relatively-moving parts, it may not suffer from stiction or backlash. In addition, when operating stresses are designed properly with respect to the yield strength of the flexure material, which may include taking into account fatigue factors and the like, according to known techniques, the flexure hinge structure 11 may have an essentially unlimited useable lifetime.

In one embodiment of the design shown in FIG. 3, the desired tuning range may be on the order of approximately +/−0.5 nm or +/−1.0 m. To achieve such a tuning range, the nominal optical path length distance $L_1$ between laser gain medium 35 and diffraction grating 40 may be about 1.905 mm, for example, and the nominal distance $L_2$ between grating 40 and the effective reflection plane of the tuning mirror 41 may be about 1.167 mm, for example. The flexure arm 14 may deflect by about +/−0.1 degrees, for example, in order to tune external cavity laser 100 over a tuning range on the order of approximately +/−0.5 nm or +/−1.0 nm.

It should be appreciated that the mechanical configurations for an external cavity tunable diode laser disclosed and taught herein may be particularly suitable for desired tuning ranges on the order of approximately +/−0.5 nm, +/−1.0 nm or +/−5 nm. For example, the flexure hinge structures and the chromatic dispersion accommodation features described herein are compatible with use over such tuning ranges, and provide numerous improvements in terms of tuning response speed and/or actuator power, operating stability and/or accuracy, number of parts, and/or ease of assembly and adjustment for mode-hop-free tuning, for use with such tuning ranges. More generally, the various features, combinations of features and/or exemplary dimensions disclosed and taught herein, may be especially desirable for use with such tuning ranges. The prior art has not recognized the value of such features, combinations of features, and/or exemplary dimensions because they may not be compatible with the wider tuning ranges and/or applications contemplated by prior art systems. However, tuning ranges on the order of +/−0.5 nm, +/−1.0 nm, or +/−5 nm may be both desirable and sufficient for use with certain tunable laser applications, for example, for use in certain one-dimensional and two-dimensional absolute-type interferometric distance, ranging, or surface profiling systems. One such system is described in co-pending U.S. patent application Ser. No. 11/193,437 which is incorporated herein by reference in its entirety. It should be recognized that the various configurations and combinations of features disclosed herein may be particularly desirable in such applications.

In some configurations, there may be unwanted components of the forces produced by an actuator. For the piezoelectric transducer 60, for example, such forces may be associated with the bending moments and deflection produced through the linkage frame 61 and flexures 12 and 13. To minimize these unwanted forces and bending moments, the flexures 12 and 13, or analogous flexures that may be attached to alternative type of actuators, may be designed to have much greater compliance than the flexure hinge structure 11. For example, they may have approximately half the thickness and twice the radius of curvature of the flexure hinge structure 11. As outlined above, various mechanical configurations according to the principles disclosed herein may have various bending and/or flexure elements that are subject to complex restoring forces and kinematics that dictate their design and behavior. To determine the precisely the nature of various motions of a configuration, and the interrelationship of the associated forces, a finite element analysis (FEA) may be performed. For example, an exemplary mesh for calculating the behavior of flexure arm 14 is shown in FIG. 4.

As flexure arm 14 is rotated, the points O, A and B shown in FIG. 4 may ideally remain collinear. However, bending stresses produced by or applied to the flexure arm 14 may tend to cause motion so that the center of the flexure hinge structure 11 O(W, V) may tend to be displaced, or the flexure arm 14 may bend. In either case, a mirror mounted on the flexure arm 14 may not pivot about an ideal stationary pivot point or hinge axis. The finite element analysis may apply reasonably expected forces and calculate the rotation angle of the flexure arm 14 from the slope of the line connecting points A and B. With knowledge of the rotation angle and position of the line connecting points A and B, the location of the effective pivot point or hinge axis may be calculated, to select or confirm a design configuration that can provide mode-hop-free tuning.

Figure 5:
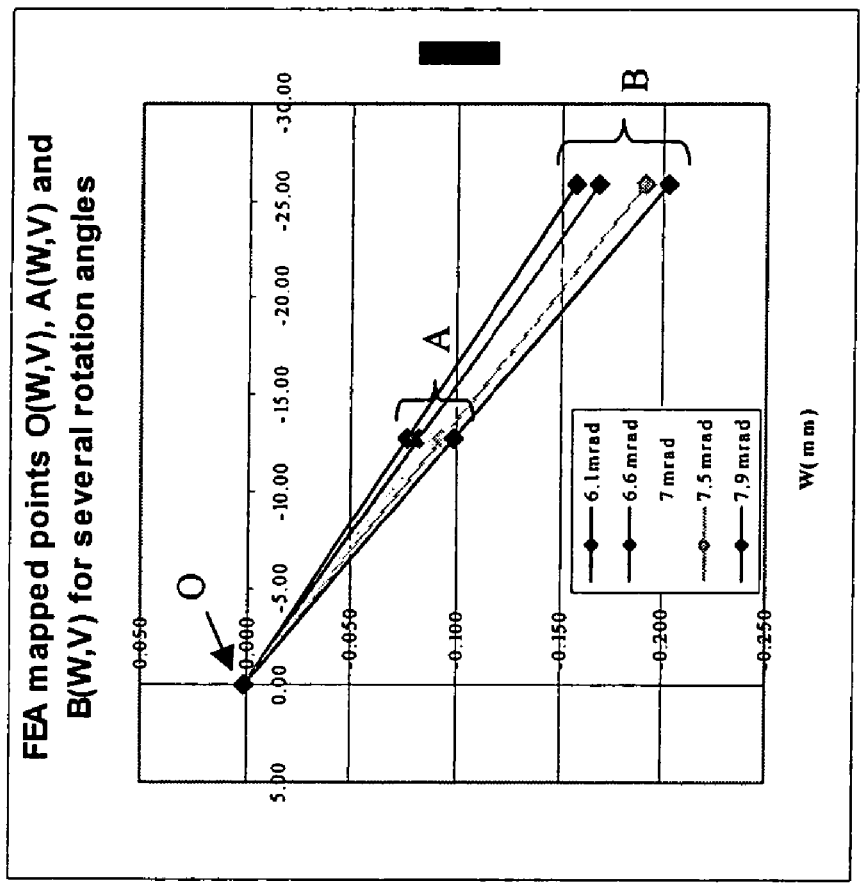
FIG. 5 shows the finite element analysis results for the mesh of FIG. 4, as a function of deflection angle.

FIG. 5 is a plot of the coordinates of O, A and B for various values of the rotation angle. FIG. 5 shows that for increasing values of the rotation angle induced by increasing deflection forces, the location of points A and B may move correspondingly; however, the point O of the flexure hinge structure 11, that is, the nominal pivot point or hinge axis, is substantially stationary.

Figure 6:
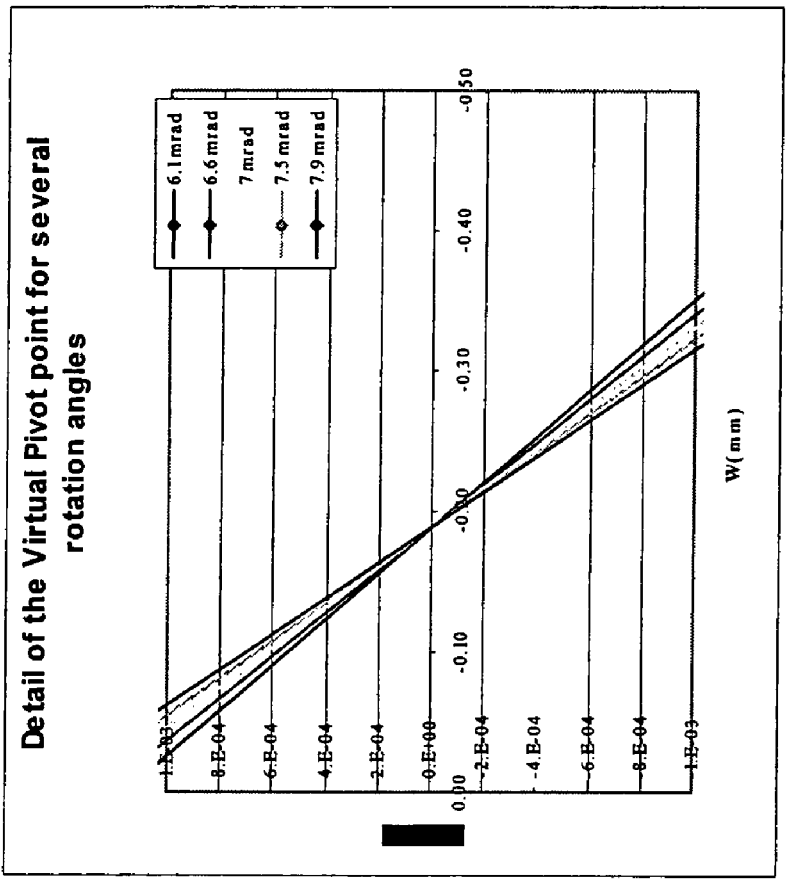
FIG. 6 shows a plot of the nominal pivot point for the flexure hinge of FIG. 4 as a function of deflection angle, as calculated by finite element analysis.

FIG. 6 shows a higher magnification plot of the location of the center point O as a function of the rotation angle induced by deflection forces. According to FIG. 6, the location of the effective stationary pivot point for the flexure arm 14 may be located at a distance of about 0.188 mm from the center of the flexure hinge 11. However, this pivot point may be stationary through the range of motion of the piezoelectric transducer 60, so that the external cavity laser may be capable of mode-hop-free tuning.

There are several other design parameters of the flexure system that may need to be considered in the design shown in FIG. 4. First, given the desired range of motion of piezoelectric transducer 60, the flexure hinge structure 11 may be preferably designed such that the elastic deformation limits are not exceeded. Second, given the desired range of motion, piezoelectric transducer 60 may preferably not be loaded past its maximum blocking force, i.e., the maximum amount of force that can be produced by the actuator. These tradeoffs may be calculated using analytical models as applied to the flexure shown in FIG. 4.

Figure 7:
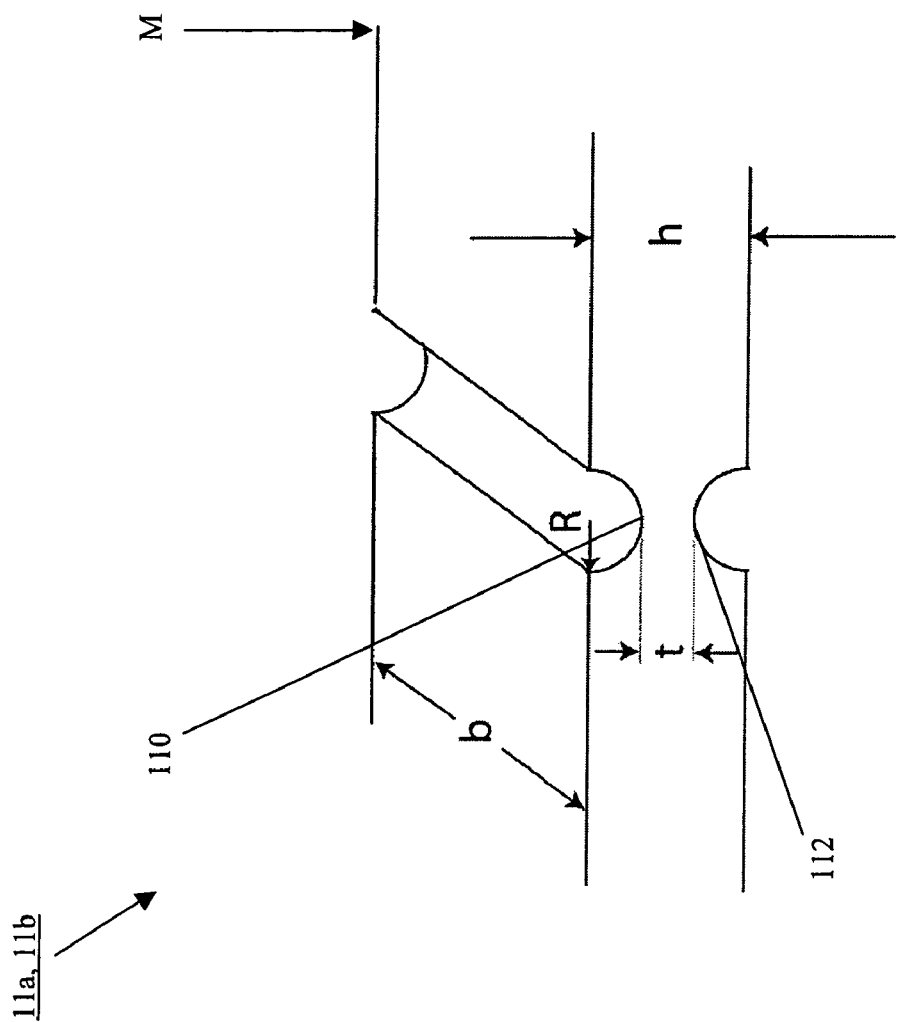
FIG. 7 shows parameters of the flexure hinge.

FIG. 7 shows an exemplary geometry of the flexure hinge structures 11a and 11b. The flexure hinge structure 11a, 11b may be formed by drilling, or otherwise forming, two cylindrical holes close together and parallel to the desired hinge axis, through an excess of material surrounding the vicinity of the flexure hinge structure 11a, 11b. The radius of the holes is R, as shown in FIG. 7, and the minimum distance between the periphery of the holes is t. The precision of the flexure may be determined by the accuracy of the shape and placement of these two holes in the vicinity of the minimum flexure thickness t, as the remainder of the flexure is of secondary importance in determining its behavior. The excess of material surrounding the vicinity of the flexure hinge structure 11a, 11b may then be removed, for example, by electrode discharge machining (EDM), to leave the semi-circular notches 110 and 112 approximately as shown. Such a procedure helps to ensure that the flexure hinge structure 11a, 11b is not mechanically over-stressed or distorted during fabrication. The resulting semi-circular notches 110 and 112 may form a flexure that acts as an elastic rotary bearing for small angles of rotation. The resulting width of the flexure may be b, and the minimum thickness may be t, and the maximum thickness may be h. The rotation angle of the bearing may vary linearly with an applied bending moment M.

The bending moment M may be given by the component of the actuator force normal to the moment arm divided by the length L of the moment arm. For small deflections and assuming that the ratio of h/(2R+t) is on the order of unity, the ratio of the hinge rotation angle θ to the bending moment M may be given by:

$$\frac{\theta}{M} = \frac{9\pi R^{1/2}}{2Ebt^{5/2}} \quad (2)$$

where E is the elastic modulus of the material and the b, t and R are as shown in FIG. 7. The above equation may be valid up to the elastic limit of the flexure material.

It should be understood that the semi-circular flexure design shown in FIG. 7 is exemplary only, and many other methods and designs may exist for making a compliant flexible hinge. Other shapes of notches, for example, square, oblate or rectangular, may be employed to create a flexible hinge. The semi-circular design shown in FIG. 7 may be employed because it is relatively straightforward to make and to model. The hinge material may be any elastic material with suitable compliance and yield strength, PH17-4 being only one example. Considerations for choosing a geometry and a suitable elastic material for the flexible hinge are discussed further below.

Mechanical system failure mechanisms may include, for example, yield failure, fracture failure and/or fatigue failure. The chief failure mechanism for ductile materials, such as metals, may be yield failure. Yield failure is an irreversible process wherein the deformation exceeds the proportionality limit of the material (the Hook's Law regime) and the material goes into plastic deformation. In ductile materials, yield failure may occur before fracture failure and is not usually visible by inspection. Fatigue failure may be caused, for example, by cyclic loading of the material and may occur at stresses that are lower than the yield stress limit of the material.

Yield failure permanently deforms the flexure material and thus may be an important limit in the design of the flexure. In flexure hinge structure 11, such as shown in FIG. 7, bending stresses may be concentrated on the surface of the flexure, where the maximum tensile and compressive forces may be exerted. The maximum bending moment $M_{max}$ before yield failure in a semi-circular notch flexure may be given by:

$$M_{max} = \frac{bt^2}{6K_t}\sigma_{max} \quad (3)$$

where $$K_t = \frac{2.7t + 5.4R}{8R + t} + 0.325 \quad (4)$$

is the stress concentration factor caused by the semi-circular notch shape and $\sigma_{max}$ is the maximum yield stress for the flexure material. From the equations above, it may be shown that the maximum angle that the flexure may be rotated through without exceeding the maximum yield stress depends only on the ratio of the radius of curvature of the notch to the thickness. Table 1 below shows exemplary maximum angles, and corresponding exemplary laser tuning ranges, given a radius R=t/2, R=t, and R=2t for PH17-4 stainless steel. The wavelength change of the laser is proportional to the angle of rotation. The wavelength range shown assumes a nominal 780 nm laser output wavelength in a Littman laser arrangement with a first order diffraction angle of 25 degrees and a diffraction grating periodicity of 1800 lines/mm.

TABLE 1

| Hinge Geometry | Maximum angle (mrad) | Maximum tuning range (nm) |
|---|---|---|
| R = t/2 | 7.8 | 3.9 |
| R = t | 9.8 | 4.9 |
| R = 2t | 12.5 | 6.3 |

It may be seen that an exemplary design configuration corresponding to the design values in Table 1, may provide a tuning rate of approximately 0.5 nm/mrad. Of course, in configurations where a longer nominal laser output wavelength is used, the maximum tuning range for a given maximum deflection angle may be increased proportionally. For example, for a nominal 1550 nm laser output wavelength, the maximum tuning ranges may approximately double, compared to those shown in Table 1. Thus, the values shown in Table 1 are exemplary only, and not limiting.

The flexure thickness t may be designed to be as stiff as possible (lowest compliance) to increase the resonant frequency of the flexure, without being so stiff that the force capability of a piezoelectric transducer, such as the assembly consisting of the piezoelectric transducer 60 including the linkage frame 61, is exceeded. As noted above, the force which may be delivered by a particular actuator is known as the blocking force of the actuator. The piezoelectric transducer 60 in combination with the linkage frame 61, for example, may have a blocking force of 194 N. In various embodiments, about +/−10 mrad of rotation may be desired, in order to encompass a desired tuning range. Using equation (3) above, and a lever arm of 25 mm, the blocking force required versus the flexure thickness for a 10 mrad rotation may be calculated.

Figure 8:
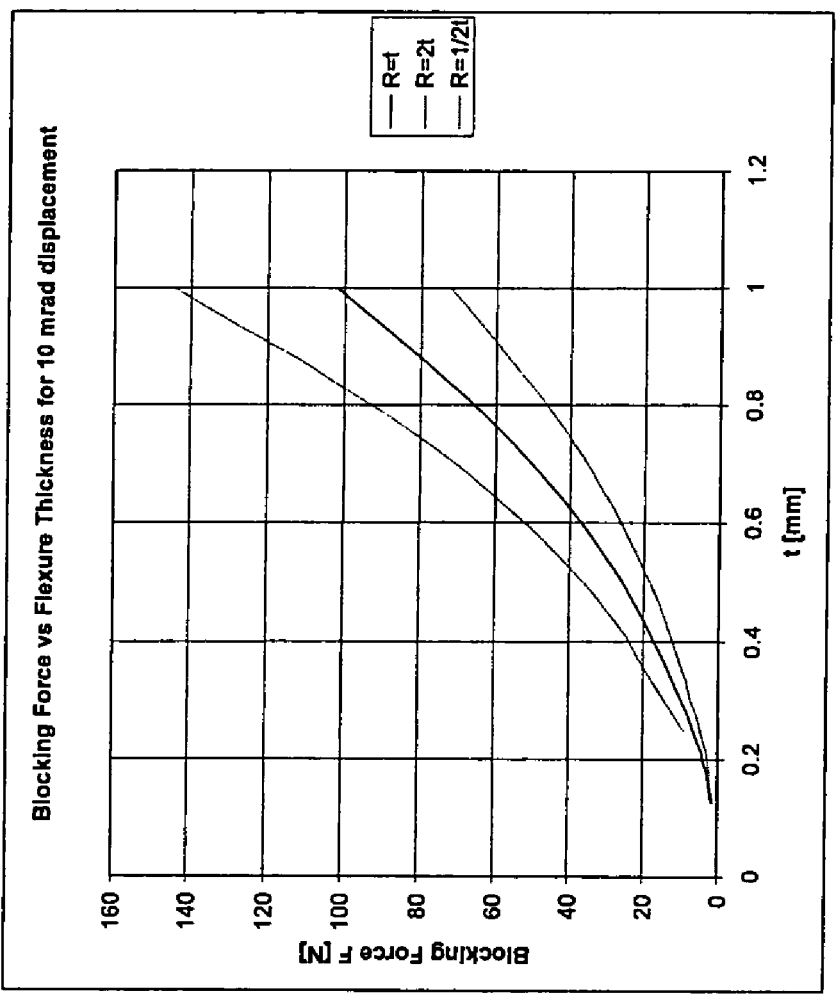
FIG. 8 is a plot of the force required to rotate the flexure hinge to an angle of 10 mrad, versus the thickness of the flexure.

FIG. 8 is an exemplary plot of the force required for a lever arm of 25 mm to rotate the flexure hinge structure 11 through an angle of 10 mrad versus the thickness of the flexure for flexure geometries of R=t/2, R=t, and R=2t, and a total width b=18 mm. As shown in FIG. 8, any of these designs may be suitable for an actuator capable of providing a blocking force greater than approximately 145 N.

It should be appreciated that an actuator, such as the piezoelectric transducer 60 depicted in FIG. 3, may be selected to fulfill multiple purposes. When the device is "off," the actuator may have a stiffness sufficient to serve as a stop to prevent the flexure arm 14 from bending beyond the maximum angle shown in Table 1, for example, as a result of shock, vibration or handling. When the actuator is on, of course it should deliver enough force to provide a desired deflection and tuning range. However, the actuator and/or its control circuit may also be selected such that the actuator cannot deliver enough force to bend a flexure hinge structure beyond its yield failure point.

Although, as discussed above, the flexure design shown in FIG. 7 may be selected to provide a stationary pivot point, the condition for mode-hop-free tuning described by Eq. (1) may be modified in the presence of chromatic dispersion. The glass of the collimating lens 36 and the laser gain medium 35 of the laser diode module 30 may exhibit chromatic dispersion that changes the optical path length through these components as a function of wavelength.

The optical path length $L_1(\lambda)$ from the back facet of the laser gain medium 35 to the grating 40 may change according to the chromatic dispersion, and may be given by:

$$L_1(\lambda) = n_d(\lambda)l_d + n_a(\lambda)l_a + n_l(\lambda)l_l \quad (5)$$

where $n_d(\lambda)l_d$ is the optical path length of the laser gain medium 35, $n_a(\lambda)l_a$ is the optical path length of the air space between the grating 40 and the laser gain medium 35, and $n_l(\lambda)l_l$ is the optical path length of the collimating lens 36. The laser medium dispersion may be difficult to model accurately because it is both a waveguide with an effective index of refraction and an active gain medium. Nevertheless, the effects of chromatic dispersion may be compensated or accommodated to achieve mode-hop-free tuning by adjusting the length $L_1$, for example, by translating laser diode gain medium 35 and collimating lens 36 (i.e., the laser diode module 30) along the optical path relative to the grating 40.

Figure 9:
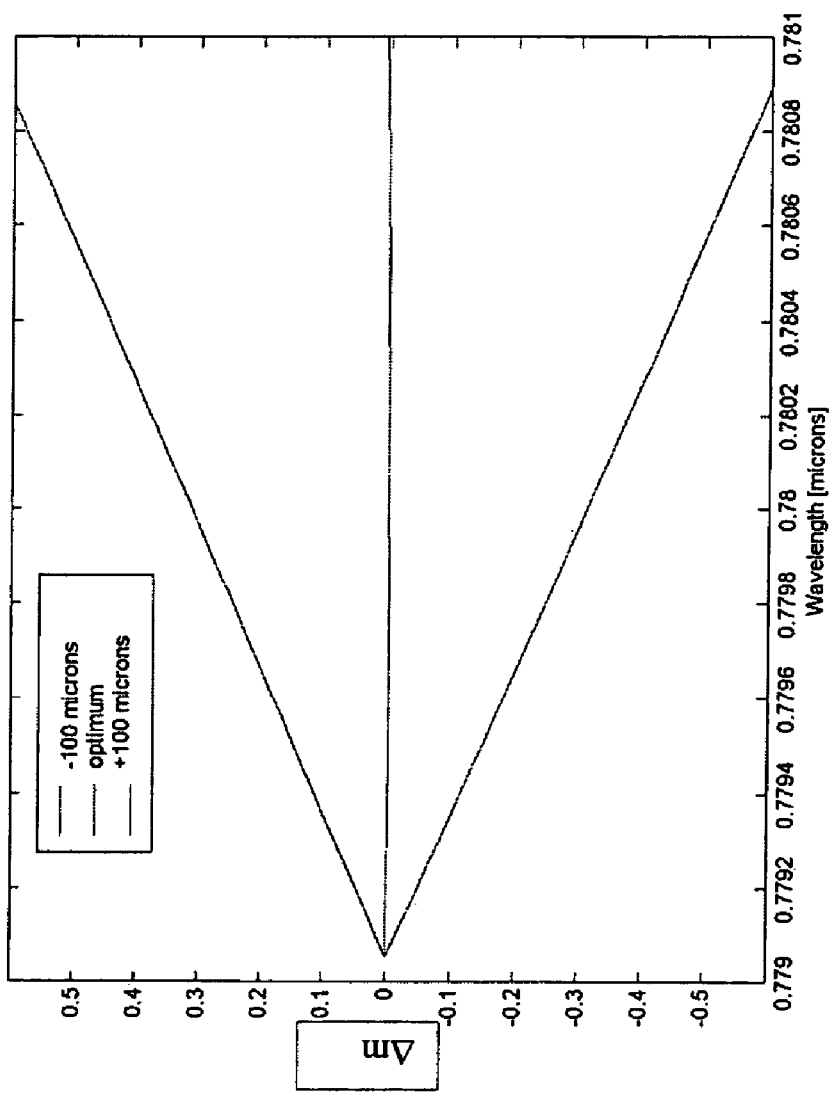
FIG. 9 is a plot showing the tuning mode errors associated with three different values for a distance between a laser diode element and a grating element in an otherwise optimally configured external cavity, as a function of the tuned wavelength of the external cavity.

For continuous tuning, the total cavity length L at the tuned wavelength must not change by an amount which allows the next adjacent mode to oscillate. We may refer to the difference from ideal tuning as the tuning mode error $\Delta m$. Mathematically, this difference may be expressed as:

$$\Delta m = 2\left[\frac{L_1(\lambda) + L_2(\lambda)}{\lambda} - \frac{L_1(\lambda_0) + L_2(\lambda_0)}{\lambda_0}\right] \quad (6)$$

where $\lambda_0$ is the center wavelength in the tuning range. FIG. 9 shows the tuning mode errors associated with three different values for $L_1$, for a 780 nm laser tuned over a wavelength range of approximately +/−1 nm (that is, 779 nm to 781 nm) as determined by the angular deflection of the tuning mirror, for a cavity with an optimal pivot point alignment. In one case, $L_1$ has an optimum or ideal length, and for two other cases $L_1$ differs by +/−100 microns in either direction from its optimum or ideal length. One configuration in which the nominal or ideal optical path length distance $L_1$ between laser gain medium 35 and diffraction grating 40 may be about 1.905 mm was described above with reference to FIG. 3. More generally, a nominal or ideal optical path length distance $L_1$ may be determined in accordance with the related teachings herein and in the incorporated references. When the value of the tuning error $\Delta m$ exceeds +/−0.5, a mode hop may occur. Thus, the model illustrated in FIG. 9 shows that mode-hop-free tuning may be restricted to a range of approximately than +/−0.8 nm (approximately 779.0-780.6 mm) if $L_1$ differs by +/−100 microns in either direction from its optimum or ideal length. The model illustrated in FIG. 9 also shows that mode-hop-free tuning over a range far exceeding +/−1 nm may be accomplished by adjusting $L_1$ to approximately an ideal length, as long as the effective pivot point of the flexure arm 14 is selected correctly and remains stationary.

It should be appreciated that although the "optimum" error line shown in FIG. 9 shows only insignificant errors, it may actually correspond to the relatively flat bottom portion of a nonlinear error curve that would reveal significant errors, such as those described in the incorporated '668 patent, if the model were plotted for an extended wavelength tuning range, for example 5-10 nm or so. Nevertheless, adjusting $L_1$ to approximately an ideal length, as described further below, is a technique that may be used in conjunction with various other design features described herein to provide a highly desirable tunable external cavity diode laser that is mode-hop-free for tuning ranges on the order of approximately +/−0.5 nm, +/−1.0 nm or +/−5 nm.

Figures 10A, 10B:
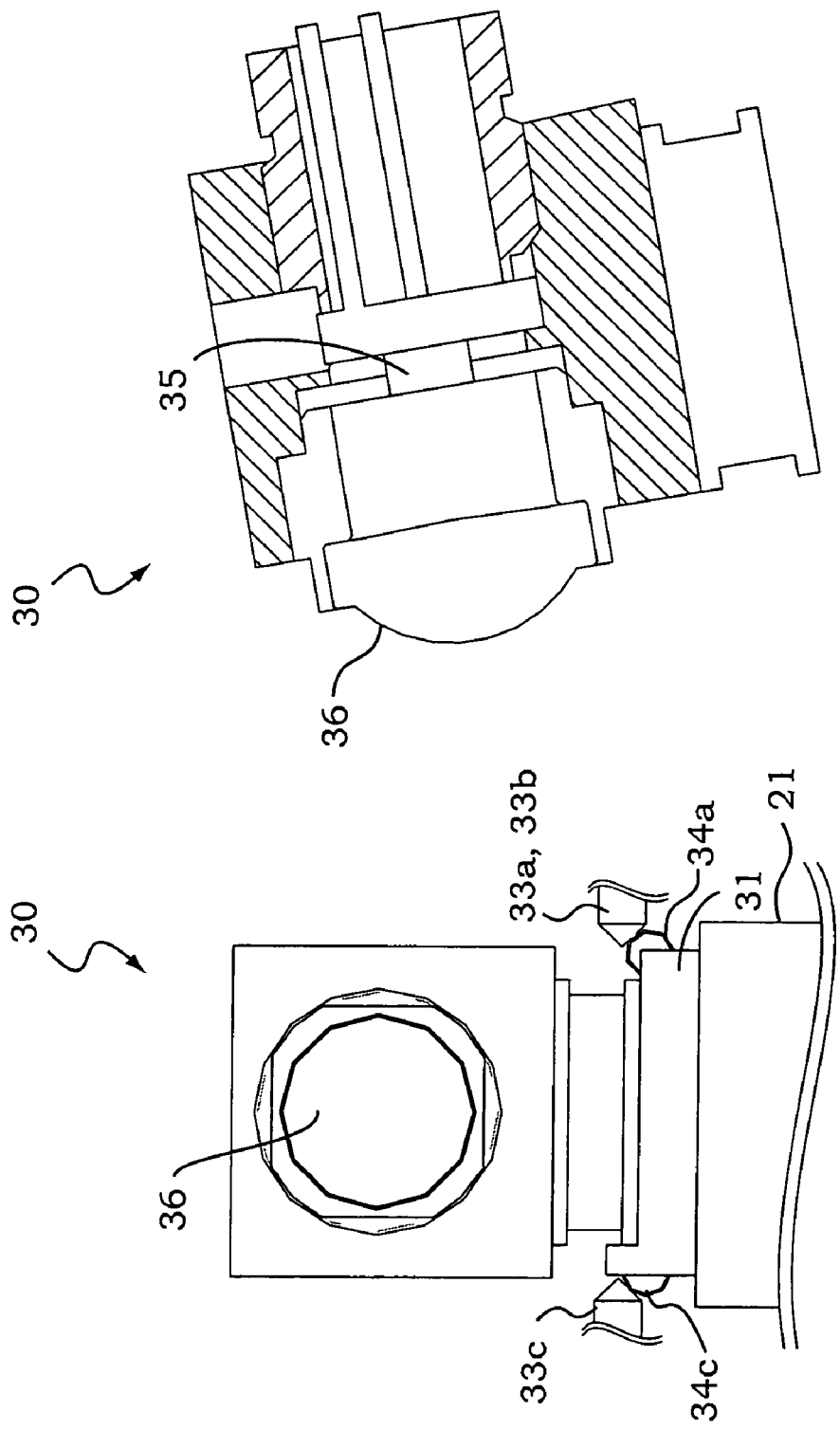
FIGS. 10a and 10b show a view approximately along the beam path of the laser diode, and a side cross-section view along a direction perpendicular to the beam path, respectively, for an exemplary laser diode module mounting mechanism.

However, for the most desirable operation, in conjunction with this adjustment for $L_1$, the laser diode module 30 must then be carefully aligned with the other components of the cavity, including the grating 40 and the tuning mirror 41. FIGS. 10a and 10b show a view approximately along the beam path from the laser diode module 30, and a side cross-section view along a direction perpendicular to the beam path, respectively, for an exemplary laser diode module 30 and an associated mounting arrangement. The alignment of the laser diode module 30 may be accomplished, for example, with the aid of alignment screws 33a, 33b and 33c shown in FIG. 10a, in a view taken approximately along the laser beam path, and an optical autocollimator (not shown). The three screws 33a, 33b and 33c may be threaded into appropriate locations on the flexure body 10, and have their ends ground to a cone shape so that they engage an upper portion of laser cell rails 34a and 34c to press a laser cell base 31 such that it is "locked" against the surface of the optical bench 21. The screws 33a and 33b may be staggered (one behind the other, in and out of the plane of the figure in FIG. 10a) so that extending and retracting the screws 33a and 33b relative to one another may also adjust the yaw of the laser beam relative to the grating. Various steps, discussed below, may be taken to ensure that the external cavity laser elements are properly aligned, and that the external cavity laser may be tuned throughout its range, free of mode hops.

For the external cavity laser to demonstrate mode stability, the feedback from the external cavity to the laser medium should be high enough to control the laser oscillation. The cavity loss may be sensitive to many aspects of the design. In order to maximize the coupling of the external cavity to the laser medium, careful design guidelines and alignment procedures may be followed, as discussed below.

Because the gain threshold of laser gain medium 35 is strongly coupled to its index of refraction, threshold gain ripple may cause undesirable phenomena such as bistability, tuning nonlinearities and/or axial mode instability. Because of these instabilities, it may be desirable to operate the laser diode in a regime where the external cavity reflectivity is much greater than the facet reflectivity. Thus, the diode laser may have an excellent antireflection coating on the front facet. In addition to strong external feedback, the cavity should be designed and assembled to ensure low loss coupling of the cavity to the laser waveguide.

A collimation lens with a sufficiently high numerical aperture may be used to ensure efficient coupling of the laser diode to the external cavity. Laser diodes typically have very large divergence angles of up to 30 degrees because of their waveguide structure. Collimating lenses with numerical apertures of NA>0.55 may be used to collimate such diodes. A laser diode with a narrower output divergence may also be used, so that the diode is more efficiently coupled and the wavefront error of the collimated beam is reduced. The lens also may be coated to reduce reflective losses.

Wavefront distortion may reduce the overlap integral between the output and return beams so all components are specified to be optically flat. A $\lambda/4$ wavefront error corresponds to a 2 dB loss in coupling efficiency. The several microns of astigmatism present in the diode laser beam may also increase the coupling loss and may be corrected to improve the performance. The chromatic aberration of the collimating lens for large tuning ranges may also affect the coupling of the laser.

The feedback from the external cavity is very sensitive to misalignment of the grating 40 and the mirror 41. Referring to FIG. 1, the collimated laser beam 4, the diffracted beam 9, and the beam reflected off the mirror 5 should all lie in a plane perpendicular to the pivot axis of the mirror 5. The alignment sensitivity for the light to be efficiently coupled back into the laser waveguide may be given by a corresponding coupling coefficient component $\kappa_t$:

$$\kappa_t = \exp[-(\delta/(\lambda/\pi\omega_g))^2] \quad (7)$$

where $\delta$ is the angular misalignment between the laser waveguide and the cavity mode and $\omega_g$ is the cavity beam waist radius. According to Eq. (7), a 30% reduction in the coupling efficiency of the external cavity may be calculated for an angular misalignment between the incident and the retroreflected beams of $\delta=15$ arcseconds. The sources of this angular error may include displacement of the collimating lens, the tip and tilt of the grating 40, and/or the angular misalignment of the tuning mirror 41.

According to Eq. (7), the coupling efficiency is highly sensitive to the alignment of the laser diode module 30 with the grating 40 and tuning mirror 41. The alignment procedure outlined below may be followed so that the laser tunes well. The alignment of the optical elements of the external cavity may be accomplished using an optical autocollimator 200.

An autocollimator is a device that projects an image of a reticle in a parallel beam onto a mirror that retroreflects the light back into the autocollimator. If the mirror is exactly perpendicular to the optical axis of the autocollimator, the beam of light is reflected along the same path. If the mirror is tilted by an angle, the reflected beam enters the autocollimator at an angle, and is focused by the objective lens to a spot that is displaced from the center of the reticle. This distance from the reticle center provides a measurement of the angular displacement of the mirror.

Figure 11:
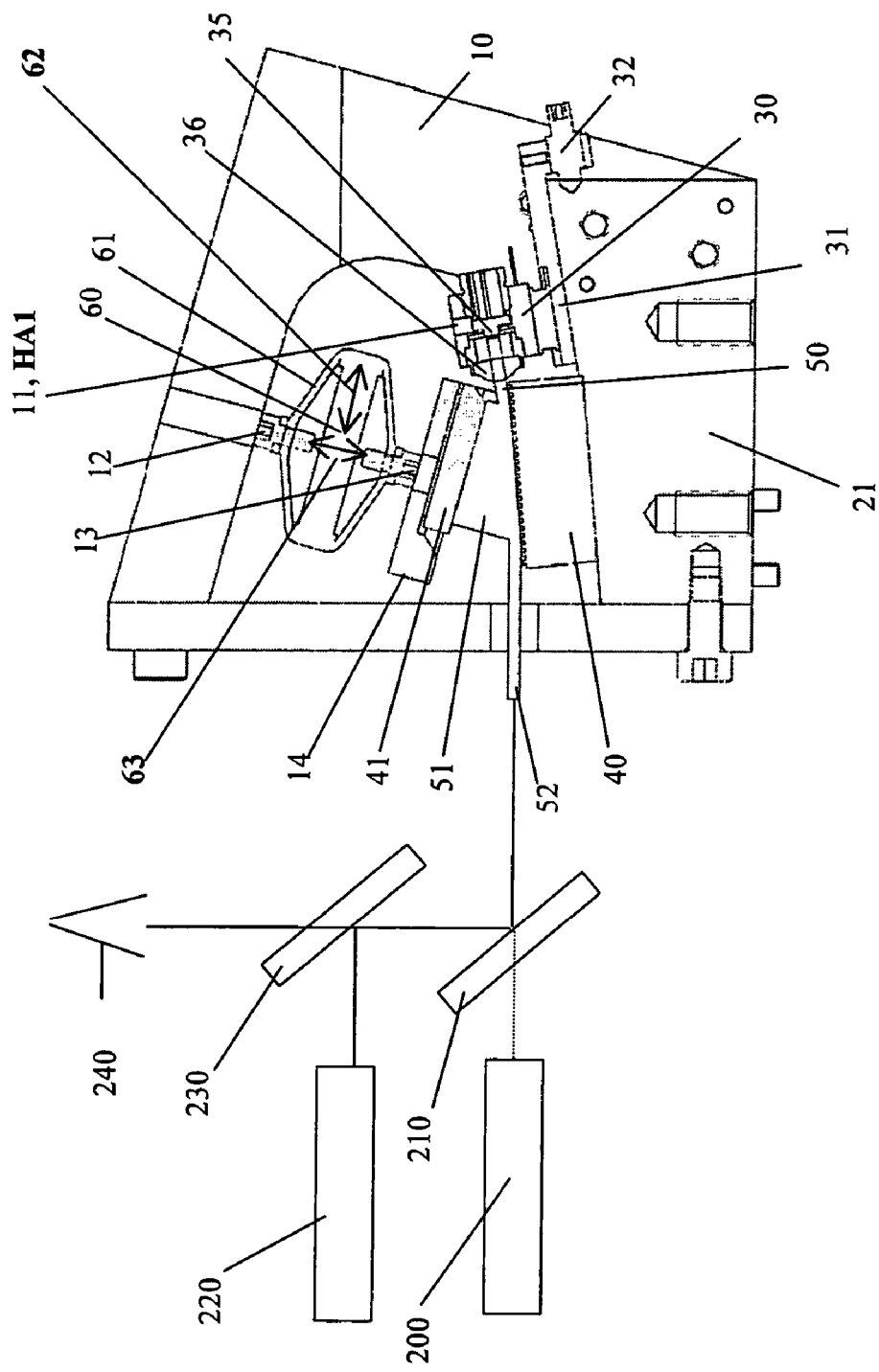
FIG. 11 shows an exemplary arrangement of an autocollimator, a photodiode and a Fabry-Perot etalon for measuring the output power of the external cavity laser diode assembly.

According to one method of alignment, in a first step, the autocollimator 200 may be referenced to surfaces on the flexure body 10 and/or optical bench 21 that are known to be parallel or perpendicular to the pivot axis of the flexure arm 14. For example the autocollimator may be aligned so that its optical axis is perpendicular to the pivot axis. The autocollimator may then be used to align the diffraction grating 40 on the optical bench 21 so that its diffraction rulings are parallel to the pivot axis. In this case the autocollimator beam's normal reflection and the Littrow diffraction off the grating are both aligned with the autocollimator reticle. In a second step, the autocollimator 200 may then be disposed as shown in FIG. 11, such that the autocollimator optical axis is aligned perpendicular to the diffraction rulings aligned in the previous step. The autocollimator may then be used to align the laser diode module 30 such that the collimated output beam 50 from the laser module and/or the output beam 52 are also aligned perpendicular to the diffraction rulings. The optical axis of the autocollimator 200 is thereby collinear with the desired optical axis of the external cavity diode laser output beam 52.

With respect to the alignment of the tuning mirror 41, a reflecting orthogonal dihedral prism may be used for the tuning mirror 41, in order to provide reasonable mechanical alignment tolerances and provide particularly robust and stable coupling between the external cavity and the laser diode. The orthogonal dihedral prism may have two roof surfaces at right angles to each other. The orthogonal dihedral prism may be mounted so that the line of intersection of the roof surfaces is orthogonal to the pivot axis of the laser cavity. A similar approach is used in U.S. Pat. No. 5,594,744, incorporated herein by reference in its entirety. The light reflects off the back orthogonal surfaces of the prism by total internal reflection so that the return beam remains in the optical plane. With the apex of the prism perpendicular to the pivot axis and parallel to the dispersion plane of the grating and collimating axes, the prism may retroreflect the laser beam along the optical plane of the laser beam regardless of small changes in the tilt of the dihedral prism. The dihedral prism may be specified to have a fabrication error $\epsilon$ in the angle of the 90 degree roof of $\epsilon<2$ arcseconds. This may minimize the out of plane deviation of the reflected laser beam relative to the incoming laser beam. The prism may also be required to have less than a quarter wave error in the wavefront of the reflected beam. This may place a stringent requirement on the parallelism of the apex of the roof with respect to the entrance face of less than 8 arcseconds.

The external cavity diode laser may be designed to be able to tune free of mode hops. The mechanical tolerance on the cavity length may be in the range of 10's of microns for continuous mode-hop-free tuning. This may be achieved by fine adjustment of the distance $L_1$ between the diffraction grating 40 and the laser diode module 30, as indicated above by the discussion related to FIG. 9. The distance $L_1$ may be adjusted, for example, by translating the laser diode module 30 along the surface of the optical bench 21, while maintaining alignment of its output beam path in a plane orthogonal to the hinge axis HA1. A fine-pitch screw 32 may be located at the back of the laser cell base 31, as shown in FIG. 3, so that controlled adjustments of the distance $L_1$ may be made.

The positioning of the laser diode module 30 may be performed by first loosening one or more of the clamping screws 33a, 33b and 33c shown in FIG. 10a. The cavity length may be then adjusted by turning the length adjustment screw 32, by half a turn, for example, to make a small adjustment to the cavity length. When making adjustments to the cavity length, the pointing alignment of the beam may vary. The autocollimator as shown in FIG. 11 may be used to ensure that the laser beam is aligned properly with respect to the pivot axis of the external cavity. The laser beam position on the autocollimator reticle may be adjusted, for example, using screws 33a and 33b to adjust the laser yaw, and screw 33c to adjust the centering. The clamping screws may then be tightened.

It should be appreciated that the clamping arrangement illustrated in FIG. 10a, including clamping screws 33a-33c, provides one alternative for adjusting the distance L1. However, numerous other clamping and/or bonding alternatives are possible. Furthermore, other external cavity diode laser configurations may be provided that include means for adjusting the distance L1 in a different manner. For example, in one configuration, an alternative flexure body similar to the flexure body 10 may integrate or include a portion similar to a portion of the optical bench 21, that includes a mounting surface where the diffraction grating 40 may be mounted and/or adjusted such that the diffraction grating 40 moves along with alternative flexure body. The laser diode module 30, or the like, may be fixed and/or adjusted on a base member the includes a portion similar to another portion of the optical bench 21, that includes a mounting surface where the laser diode module 30 may be mounted and/or adjusted such that the laser diode module 30 moves along with the base member. The base member and the alternative flexure body may include complementary mating and alignment surfaces that are nominally parallel to the expected orientation of the collimated output beam 50 when assembled. Thus, the alternative flexure body, including the the diffraction grating 40, may be adjusted along the direction of the collimated output beam 50, relative to the base member, in order to adjust the distance L1.

Regardless of the method of adjustment, to adjust and/or verify the proper setting for the distance $L_1$, the laser wavelength may then be scanned over the desired tuning range, for example, by applying voltage of between 0 and 150 V to the piezoelectric transducer 60. The voltage may be applied to the piezoelectric transducer 60 as a triangle wave at 30 Hz, for example, which may scan the laser over its full wavelength range. While scanning, using the configuration shown in FIG. 11, the output of the laser may be monitored using a photodiode 240 for the laser power and a Fabry-Perot etalon transmission detector 220 for establishing a wavelength scale along the wavelength scan range. The transmission peaks of the Fabry-Perot etalon transmission detector 220 may occur every 8 GHz, for example, to provide a wavelength reference signal synchronized with the output power signal. The laser beam 52 may be deflected by beam splitters 210 and 230 into the autocollimator 200 and the Fabry-Perot etalon transmission detector 220, as shown in FIG. 11.

Figure 12:
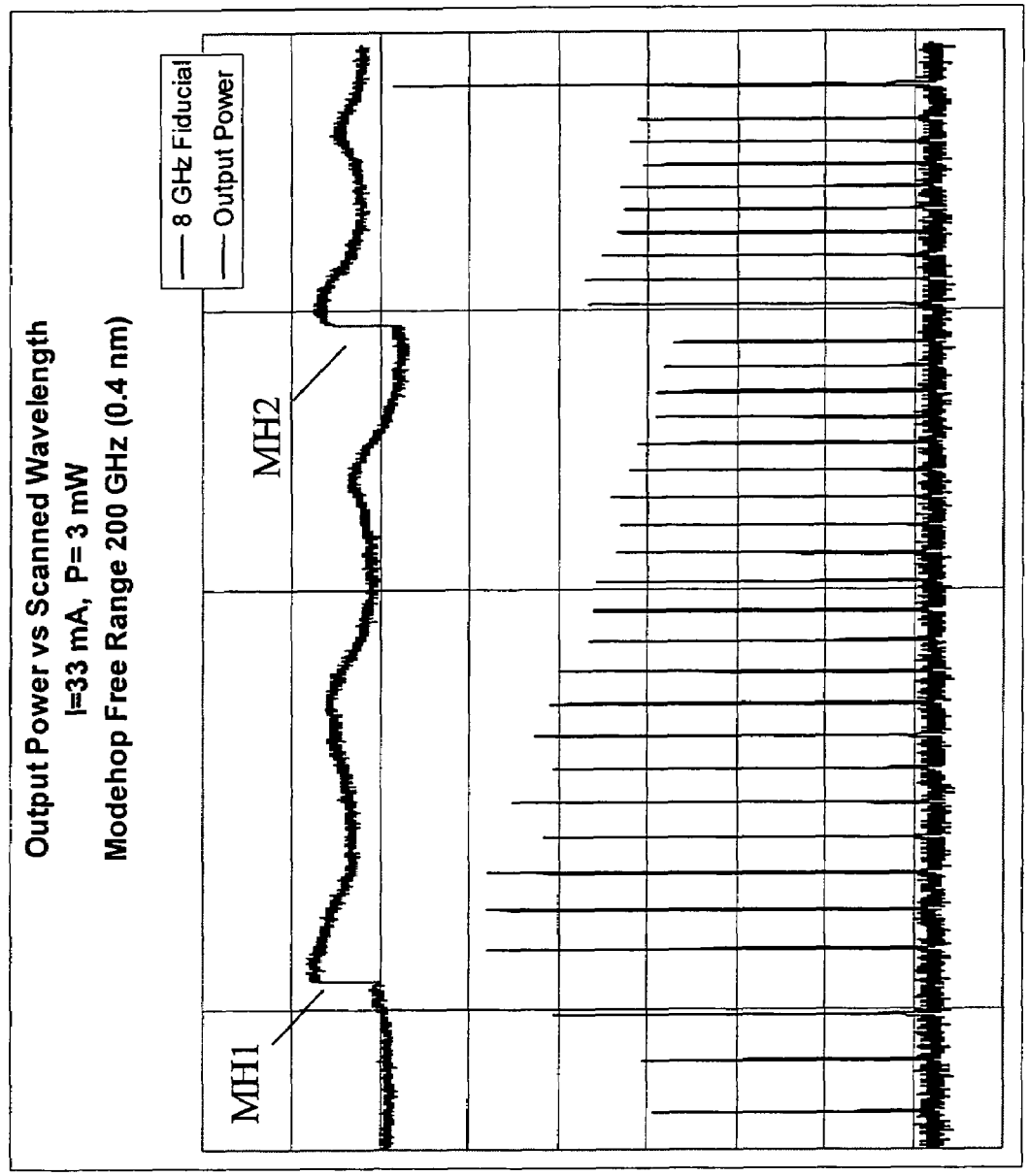
FIG. 12 shows a wavelength scan of the laser diode output power showing mode hops over the tuning range.

FIG. 12 shows experimental results of the process described above. The top trace is the power output of the photodiode 240 for a case where mode hops exist at the locations marked MH1 and MH2, and the bottom trace shows the Fabry-Perot transmission detector 220 transmission peaks. The tuning range for FIG. 12 is 0.88 nm. In the data shown in FIG. 12, two discontinuous jumps, MH1 and MH2, are shown in the output power, which may correspond to mode hops by the laser between axial modes. The input current to the laser diode is 33 mA, and the average output power, as detected by photodiode 240, is about 3 mW. As shown in FIG. 12, the mode-hop-free tuning range is about 0.4 nm, so that two mode hops may be observed over the 0.88 nm scanning range.

Figure 13:
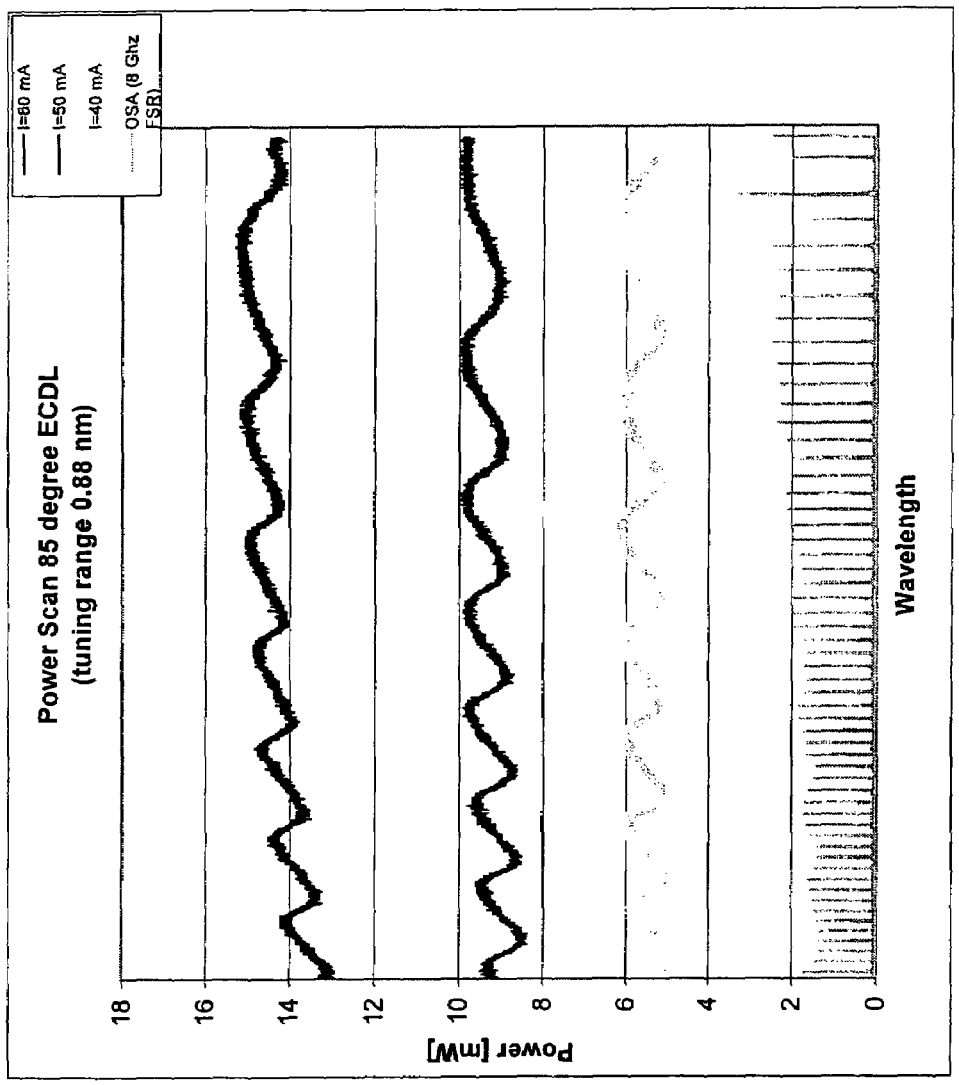
FIG. 13 shows a wavelength scan of the laser diode output power showing no mode hops over the tuning range.

FIG. 13 shows experimental results after adjustment of the distance $L_1$, as described above, while maintaining alignment of the laser diode module 30. After adjustment of the distance $L_1$, the laser may show a smoothly varying continuous power output as a function of wavelength, indicating mode-hop-free tuning. The smoothly varying oscillation in laser power may be due to interference between the cavity formed by the solitary diode and the external cavity. The three different output curves in FIG. 13 correspond to three different driving currents for the laser diode, 40 mA (lower curve), 50 mA (middle curve) and 60 mA (upper curve). The bottom trace shows the Fabry-Perot transmission detector 220 transmission peaks, as previously described with reference to FIG. 12.

It should be appreciated that, various exemplary embodiments may provide external cavity diode lasers that may be scanned at very high speeds with high accuracy and reliability, while using particularly economical, durable and robust tuning components.

It should be appreciated, from the above discussion, that such external cavity lasers may have numerous applications, including use in dense wavelength divisional multiplexing telecommunication systems, where extremely narrow and precisely controlled transmission wavelengths are desirable, as well as use in multi-wavelength (absolute) phase shifting interferometry, testing equipment and laboratory instrumentation.

While various details are described in conjunction with the exemplary embodiments outlined above, it is evident that many alternatives, modifications and variations will be apparent based on a review of the disclosure to those skilled in the art. Accordingly, the exemplary details set forth above are intended to be illustrative, and not limiting.

What is claimed is:

1. An external cavity laser, comprising:
   a laser radiation source that includes a gain medium having a back facet and a front facet and a collimating lens positioned to receive radiation from the front facet and to output a collimated beam of radiation away from the front facet along a collimated beam optical path;
   a grating element, a surface plane of the grating element positioned to receive the collimated beam of radiation along the collimated beam optical path, and to provide a first order diffracted beam of radiation and a reflected zero order output beam of radiation;
   a monolithic flexure body comprising a rigid frame, a flexure arm monolithically attached to the rigid frame by a flexure hinge, a first actuator mounting element attached to the rigid frame, and a second actuator mounting element attached to the flexure arm;
   a tuning mirror mounted to the flexure arm to pivot about a hinge axis of the flexure hinge, wherein the tuning mirror is positioned to receive the diffracted beam approximately at normal incidence to an effective reflection plane of the tuning mirror and to reflect the diffracted beam of radiation back to the grating element where the diffracted beam of radiation is diffracted back to the laser radiation source and the hinge axis approximately corresponds to an intersection of the effective reflecting plane and the surface plane of the grating element; and
   an actuator located between the first and second actuator mounting elements and attached to the first mounting element at a first actuator attachment location and attached to the second mounting element at a second actuator attachment location, the actuator operable to controllably pivot the flexure arm and the tuning mirror about the hinge axis of the flexure hinge in order to controllably tune an operating wavelength of the external cavity laser, wherein
   the first actuator driver mounting element comprises a first actuator mounting flexure element located proximate to the first actuator attachment location; and
   the second actuator driver mounting element comprises a second flexure element located proximate to the second actuator attachment location.

2. The external cavity laser of claim 1, wherein the flexure arm includes a tuning mirror carrying surface that nominally abuts a mounting surface of the tuning mirror, and the tuning mirror carrying surface is not adjustable relative to the flexure arm.

3. The external cavity laser of claim 2, wherein:
   a total optical path length of the external cavity laser consists of a first optical path distance L1 defined between the back facet and a diffraction location on the surface plane of the grating element and including the collimated beam optical path, and a second optical path distance L2 defined along the first order diffracted beam between the diffraction location on the surface plane of the grating element and the effective reflection plane of the tuning mirror;
   the external cavity laser is configured to include a single translational degree of freedom adjustment feature that may be adjusted to adjust the first optical path distance L1 without affecting the second optical path distance L2; and
   the single degree of freedom adjustment feature that may be adjusted to adjust the first optical path distance L1 is configured to provide an adjustment that consists of adjusting the position of the laser radiation source relative to the remainder of the external cavity laser along a translational direction that is collinear with an optical path of the collimated beam.

4. A method for adjusting an external cavity laser to accommodate at least the effects of chromatic dispersion, in order to provide mode-hop-free tuning over a maximum specified tuning range, the method comprising:
   providing the external cavity laser claim 3;
   activating the actuator in order to pivot the tuning mirror about the hinge axis of the flexure hinge such that the external cavity laser scans over at least the maximum specified tuning range;
   monitoring an output power of the external cavity laser over at least the maximum specified tuning range while the actuator is activated to scan the external cavity laser over at least the maximum specified tuning range;
   adjusting the single adjustment feature of claim 3 based on the monitored output power, wherein:
      the adjusting adjusts the first optical path distance L1; and
      the adjusting is stopped when the distance L1 is set such that monitored output power indicates that mode-hop-free tuning is provided at least over the maximum specified tuning range.

5. The method of claim 4, wherein the adjusting is stopped when the distance L1 is set such that the monitored output power is free of discontinuous jumps at least over the maximum specified tuning range.

6. The external cavity laser of claim 3, wherein the single translational degree of freedom adjustment feature that may be adjusted to adjust the first optical path distance L1 is the only adjustment feature provided in the external cavity laser for adjusting the external cavity laser to provide mode-hop-free tuning over a tuning range of the external cavity laser.

7. The external cavity laser of claim 1, wherein the actuator comprises an electrically driven element and a linkage frame that couples the electrically driven element to the first and second actuator mounting elements.

8. The external cavity laser of claim 1, wherein the first actuator mounting flexure element has a first actuator mounting flexure hinge axis, the second actuator mounting flexure element has a second actuator mounting flexure hinge axis, and the each of the first and second actuator mounting flexure elements has a respective bending compliance about its respective actuator mounting flexure hinge axis that is more compliant than a bending compliance of the flexure hinge about its hinge axis.

9. The external cavity laser of claim 1, wherein the flexure hinge is formed with a respective thickness and radius of curvature, and the first and second actuator mounting flexure elements are each formed with a respective thickness and radius of curvature, and the respective thickness of each of the first and second actuator mounting flexure elements is less than the respective thickness of the flexure hinge, and the respective radius of curvature of each of the first and second actuator mounting flexure elements is greater than the respective radius of curvature of the flexure hinge.

10. The external cavity laser of claim 1, wherein the first actuator mounting flexure element has a first actuator mounting flexure hinge axis, the second actuator mounting flexure element has a second actuator mounting flexure hinge axis that is approximately parallel to the first actuator mounting flexure hinge axis, and the first and second actuator attachment locations approximately coincide with a plane including the first and second actuator mounting flexure hinge axes.

11. The external cavity laser of claim 1, wherein the actuator comprises an electrically driven force generating element and a linkage frame that is coupled to the electrically driven force generating element and that is attached to each of the first and second actuator attachment locations, wherein the electrically driven force generating element and the linkage frame are configured such that when the electrically driven force generating element is electrically driven it has a size change along a plane transverse to a line between the first and second actuator attachment locations, and the size change is coupled to the linkage frame and distorts the linkage frame, and the linkage frame distorts such that it changes its dimension along the line between the first and second actuator attachment locations.

12. The external cavity laser of claim 1, wherein the first actuator mounting flexure element is monolithically joined to the rigid frame and the second actuator mounting flexure element is monolithically joined to the flexure arm.

13. The external cavity laser of claim 1, wherein the flexure arm includes no adjustable elements.

* * * * *